(12) United States Patent
Orcutt et al.

(10) Patent No.: US 9,316,787 B1
(45) Date of Patent: Apr. 19, 2016

(54) CONTINUOUS EVANESCENT PERTURBATION GRATINGS IN A SILICON PHOTONIC DEVICE

(71) Applicant: International Business Machines Corporation, Armonk, NY (US)

(72) Inventors: Jason S. Orcutt, Katonah, NY (US); Fnu Purnawirman, Watertown, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/707,262

(22) Filed: May 8, 2015

(51) Int. Cl.
| | |
|---|---|
| *G02B 6/10* | (2006.01) |
| *G02B 6/34* | (2006.01) |
| *B29D 11/00* | (2006.01) |
| *G03F 7/00* | (2006.01) |
| *G02B 6/124* | (2006.01) |
| *G02B 6/122* | (2006.01) |
| *G02B 6/136* | (2006.01) |
| *G02B 6/02* | (2006.01) |
| *G02B 6/12* | (2006.01) |

(52) U.S. Cl.
CPC ............... *G02B 6/124* (2013.01); *G02B 6/122* (2013.01); *G02B 6/1228* (2013.01); *G02B 6/136* (2013.01); *G02B 6/02061* (2013.01); *G02B 2006/12061* (2013.01); *G02B 2006/12107* (2013.01); *G02B 2006/12173* (2013.01); *G02B 2006/12176* (2013.01); *H01L 2933/0041* (2013.01)

(58) Field of Classification Search
CPC .. G02B 6/02061; G02B 6/1228; G02B 6/122; G02B 6/124; G02B 6/136; G02B 2006/12061; G02B 2006/12107; G02B 2006/12173; G02B 2006/12176; G03F 7/0005; G03F 1/80; H01L 2933/0041
USPC ........ 385/37, 129–132; 430/321–323; 216/24
See application file for complete search history.

(56) References Cited

U.S. PATENT DOCUMENTS

| | | | |
|---|---|---|---|
| 5,104,209 A | 4/1992 | Hill et al. | |
| 6,728,444 B2 | 4/2004 | Brennan, III et al. | |
| 7,260,290 B1 | 8/2007 | Greiner et al. | |
| 8,026,022 B2 * | 9/2011 | Hsu ..................... | G02B 6/02138 430/1 |

(Continued)

OTHER PUBLICATIONS

List of IBM Patents or Patent Applications Treated as Related; (Appendix P), Filed Jul. 9, 2015; 2 pages.

(Continued)

*Primary Examiner* — Akm Enayet Ullah
*Assistant Examiner* — Michael Mooney
(74) *Attorney, Agent, or Firm* — Cantor Colburn LLP; Vazken Alexanian (57) ABSTRACT

A method of fabricating a silicon photonic device and a system including a silicon photonic device are described. The method includes forming a photoresist layer on a silicon layer and patterning a mask formed on the photoresist layer. The patterning defines a primary optical waveguide region, a first evanescent perturbation grating region on a first side of the primary optical waveguide region and a second evanescent perturbation grating region on a second side, opposite the first side, of the primary optical waveguide. The first evanescent perturbation grating region and the second evanescent perturbation grating region are defined as continuous regions along a length of the silicon photonic device. The method also includes etching the photoresist layer and the silicon layer according to a pattern of the patterned mask.

9 Claims, 10 Drawing Sheets

(56) References Cited

U.S. PATENT DOCUMENTS

| 8,227,178 | B2* | 7/2012 | Sakuma | G02B 6/124 |
| | | | | 216/24 |
| 8,503,839 | B2 | 8/2013 | Cheben et al. | |
| 8,538,207 | B2 | 9/2013 | Gates et al. | |
| 8,842,948 | B2 | 9/2014 | Mazumder et al. | |

OTHER PUBLICATIONS

Jason S. Orcutt et al "Continuous Evanescent Perturbation Gratings in a Silicon Photonic Device", U.S. Appl. No. 14/744,740, filed Jun. 19, 2015.

Giuntoni et al., "Tunable Bragg reflectors on silicon-on-insulator rib waveguides," Optics Express, vol. 17, No. 21, 2009, pp. 18518-18524.

Loiacono et al., "Low energy silicon on insulator ion implanted gratings for optical wafer scale testing," Proc. of SPIE, vol. 7943, 2011, pp. 1-6.

Tan et al., "Cladding-modulated Bragg gratings in silicon waveguides," Optics Letters, vol. 34, No. 9, 2009, pp. 1357-1359.

Tan et al., "Wide bandwidth, low loss 1 by 4 wavelength division multiplexer on silicon for optical interconnects," Optics Express, vol. 19, No. 3, 2011, pp. 2401-2409.

Wang et al., "Narrow-band waveguide Bragg gratings on SOI wafers with CMOS-compatible fabrication process," Optics Express, vol. 20, No. 14, 2012, pp. 15547-15558.

* cited by examiner

FIG. 13

CONTINUOUS EVANESCENT PERTURBATION GRATINGS IN A SILICON PHOTONIC DEVICE

BACKGROUND

The present invention relates to a silicon photonic device, and more specifically, to continuous evanescent perturbation gratings in a silicon photonic device.

Light is used as a data carrier in many applications because light can transmit energy over longer distances than other guided wave carriers such as radio frequency (RF) energy, for example. Optical waveguides that guide electromagnetic energy in the optical spectrum (light) have different properties based on factors such as geometry, mode structure, and material. Silicon photonic devices use silicon as the optical medium and are made using semiconductor fabrication techniques. Silicon photonic devices have numerous applications. For example, silicon photonic devices may transmit or filter light. The silicon photonic device may act as a reflector such that, in conjunction with an optical gain region, the silicon photonic device forms a laser cavity to transmit at a controlled optical frequency. The waveguides or silicon photonic devices may be used on the transmit or receive side (or both) of a communication system. Silicon photonic devices may also be used as interconnects and in sensors, for example. A silicon photonic device includes a primary optical waveguide core region in which light is nominally confined. The silicon photonic device also includes evanescent wave regions proximate to the primary optical waveguide core that define the overall function of the device.

SUMMARY

According to one embodiment of the present invention, a method of fabricating a silicon photonic device includes forming a photoresist layer on a silicon layer; patterning a mask formed on the photoresist layer, the patterning the mask defining a primary optical waveguide region, a first evanescent perturbation grating region on a first side of the primary optical waveguide region and a second evanescent perturbation grating region on a second side, opposite the first side, of the primary optical waveguide, the first evanescent perturbation grating region and the second evanescent perturbation grating region being defined as continuous regions along a length of the silicon photonic device; and etching the photoresist layer and the silicon layer according to a pattern of the patterned mask.

According to another embodiment, an optical system includes an incident light source; and a silicon photonic device that includes a primary optical waveguide region; a first evanescent perturbation grating region on a first side of the primary optical region; and a second evanescent perturbation grating region on a second side, opposite the first side, of the primary optical region, wherein the first evanescent perturbation grating region and the second evanescent perturbation grating region are formed as continuous features in a same silicon layer as the primary optical waveguide region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 11-13 are cross-sectional views of intermediate structures involved in the fabrication of a silicon photonic device according to embodiments, in which:

DETAILED DESCRIPTION

As noted above, silicon photonic devices include a primary optical waveguide and evanescent regions. The gratings in the evanescent regions define the overall function of the device. Prior gratings were etched into the primary optical waveguide or formed of isolated perturbation elements such that the perturbations are in-plane with the primary optical waveguide. Issues arising from these prior gratings include weak modulation and non-uniformity. Embodiments of the systems and methods described herein relate to continuous evanescent perturbation gratings in a silicon photonic device. Silicon photonic devices have a primary optical waveguide that is etched in the top silicon layer of a silicon-on-insulator (SOI) substrate. According to the embodiments herein, in the same etch layer used to form the primary optical waveguide, an index perturbation grating is formed as a continuous feature that is modulated in width, spacing to the primary optical waveguide, or both. The grating design according to the embodiments detailed herein may be manufactured without a design rule constraint, which is necessary for manufacturing the gratings formed as isolated elements. Continuous evanescent perturbation gratings may be formed on each side of the primary optical waveguide.

Figure 1:
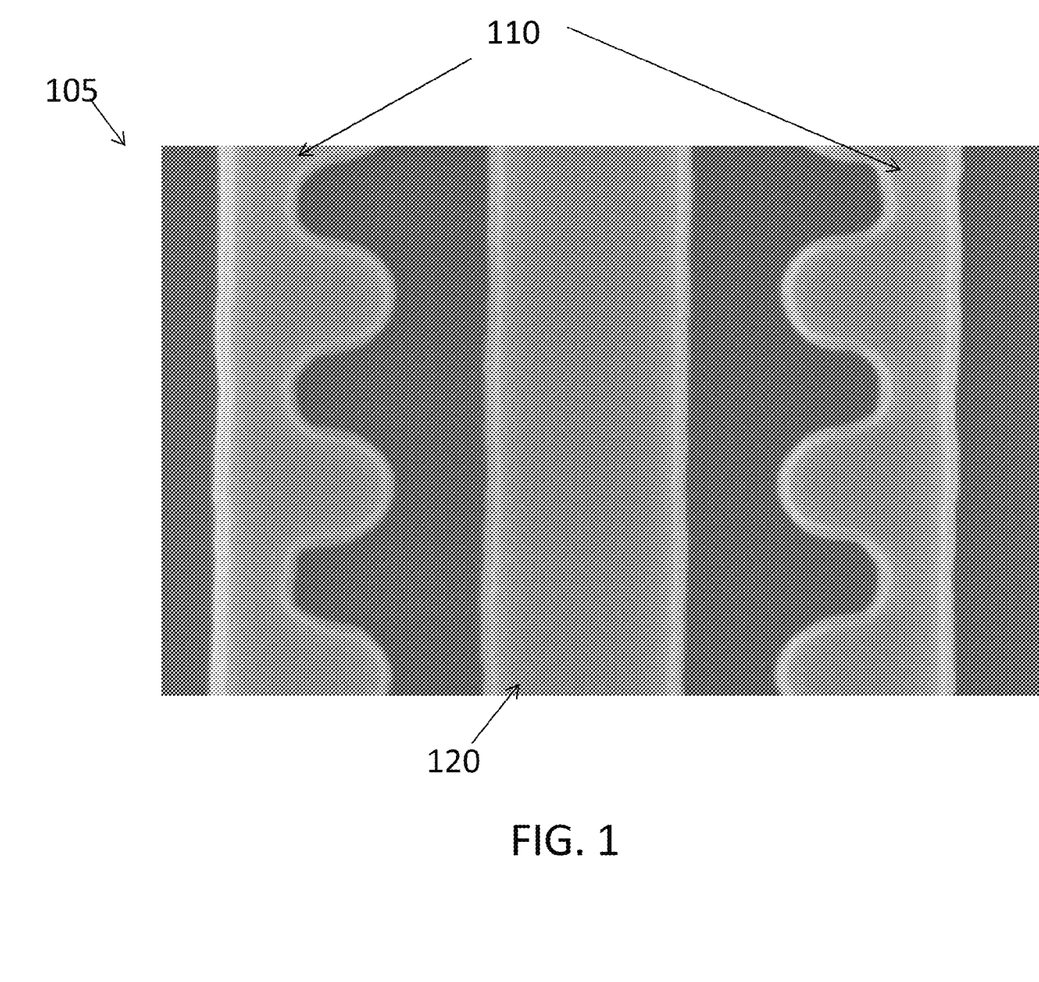
FIG. 1 shows a scanning electron micrograph image of a silicon photonic device according to an embodiment.

FIG. 1 shows a scanning electron micrograph image 105 of a silicon photonic device 100 according to an embodiment. The silicon photonic device 100 includes continuous evanescent perturbation gratings 110. The primary optical waveguide 120 of the silicon photonic device 100 is also shown. Generally, the primary optical waveguide 120 may have a same width over the entire length as shown in the embodiments herein. Both the primary optical waveguide 120 and continuous evanescent perturbation gratings 110 are etched as continuous structures. Standard optical lithography techniques that use a patterned mask may be used in this case. Prior gratings are formed using electron beam lithography, which involves etching the photoresist directly (without using a patterned mask), a technique that is susceptible to repeatability issues. As further discussed below, the overall function of the silicon photonic device 100 is defined by the continuous evanescent perturbation gratings 110 formed on either side of the primary optical waveguide 120.

Figure 2:
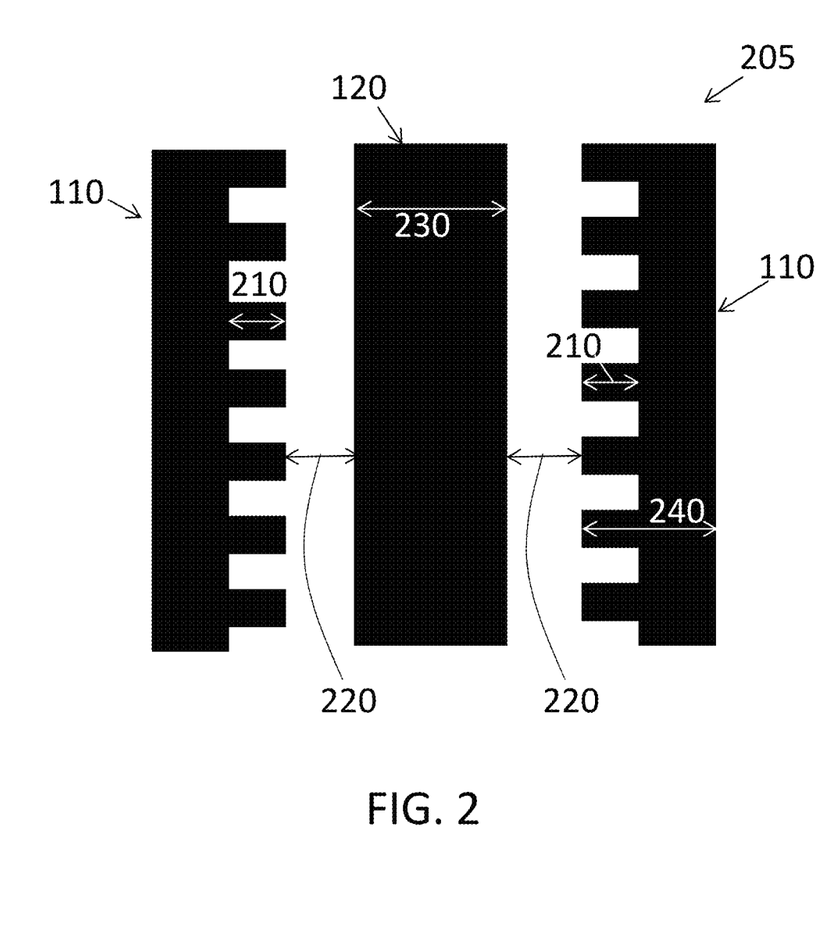
FIG. 2 illustrates a design of a silicon photonic device corresponding to the scanning electron micrograph image shown in FIG. 1.

FIG. 2 illustrates a design 205 of a silicon photonic device 100 corresponding to the scanning electron micrograph image 105 shown in FIG. 1. FIG. 2 may be regarded as showing the lithographic design definition or outline of the lithographic mask used to form the continuous evanescent perturbation gratings 110 shown in FIG. 1. The continuous evanescent perturbation gratings 110 according to the embodiment shown in FIGS. 1 and 2 include sawtooth or Manhattan gratings, which derive their name from the 90 degree angles of the grating structure as shown in FIG. 2. As the scanning electron micrograph image 105 of FIG. 2 shows, however, these 90 degree angles become rounded as a result of the optical lithography. Coupling between the primary optical waveguide 120 and each of the continuous evanescent perturbation gratings 110 varies in strength based on the tooth height 210 of the sawtooth shapes, the orientation of the teeth (e.g., in comparison with the orientation shown in FIG. 3), and the gap 220 between the continuous evanescent perturbation gratings 110 and the primary optical waveguide 120. As FIG. 2 indicates, the continuous evanescent perturbation gratings 110 are formed symmetrically on each side of the primary optical waveguide 120. The arrangement of the continuous evanescent perturbation gratings 110 shown in FIG. 2 results in high coupling coefficient variant in comparison to the arrangement of the continuous evanescent perturbation gratings 110 shown in FIG. 3, for example. An exemplary tooth height 210 may be 100 to 200 nanometers (nm) and an exemplary gap 220 may be 100 to 500 nm, for example. The width of the primary optical waveguide 120 may be 280 to 350 nm and the widest part of the continuous evanescent perturbation gratings 110 may be 220 to 320 nm.

Figure 3:
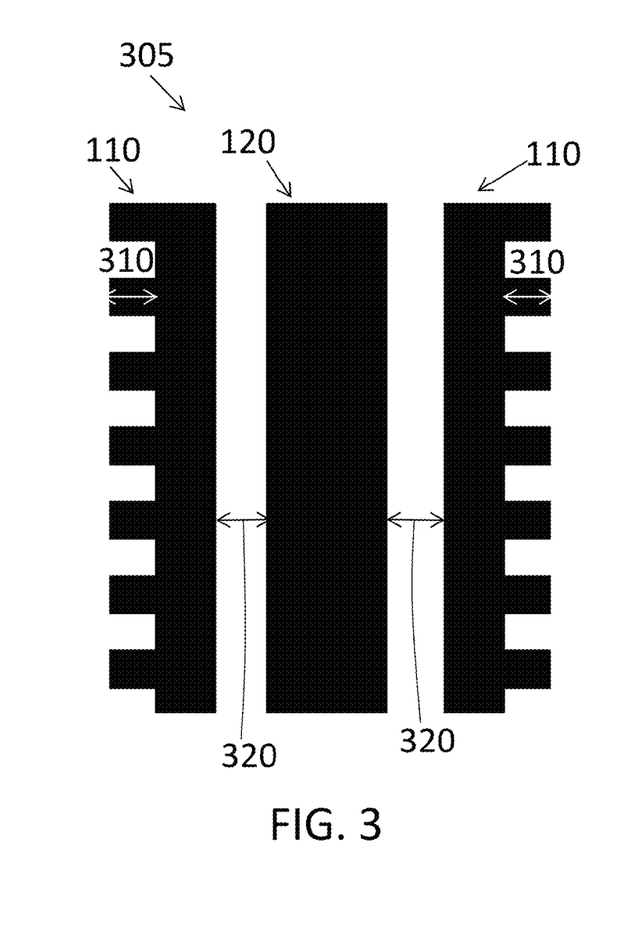
FIG. 3 illustrates a design of the silicon photonic device according to another embodiment.
Figure 4:
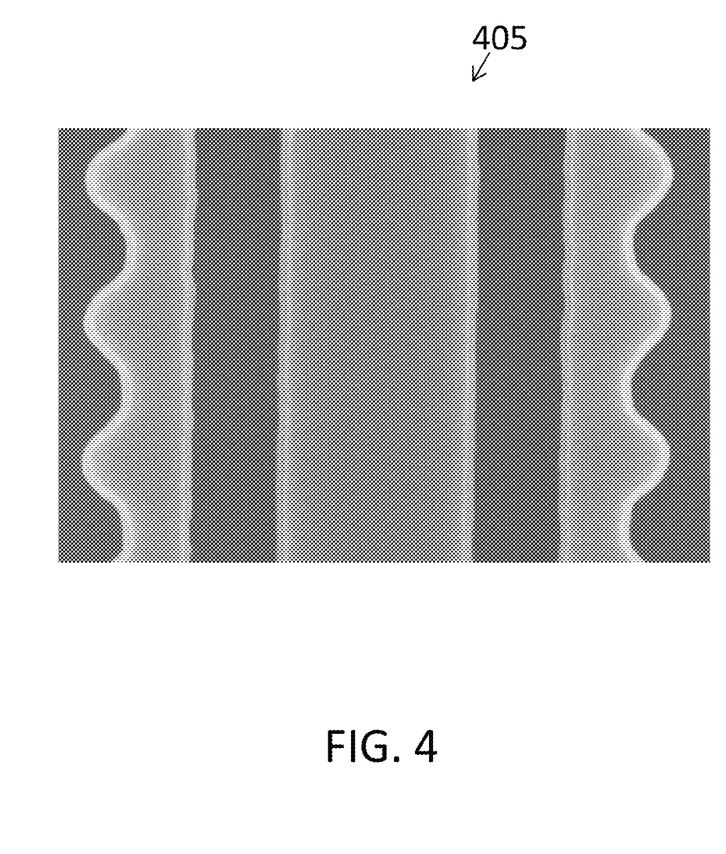
FIG. 4 shows a scanning electron micrograph image of the silicon photonic device corresponding to the design shown in FIG. 3.

FIG. 3 illustrates a design 305 of the silicon photonic device 100 according to another embodiment. The continuous evanescent perturbation gratings 110 according to the embodiment show in FIG. 3 are also sawtooth or Manhattan gratings, as discussed with reference to FIG. 2. However, the orientation of the continuous evanescent perturbation gratings 110 in FIG. 3 differs from those in FIGS. 1 and 2, in that the teeth of the evanescent perturbation gratings 110 face outward with respect to the primary optical waveguide 120, instead of inward as in FIG. 2. The silicon photonic device 100 resulting from the design 305 shown in FIG. 3 exhibits weaker coupling than the silicon photonic device 100 resulting from the design 205 shown in FIG. 2. For each design 205, 305 with a given orientation, the coupling strength is affected by tooth height 310 and gap 320. FIG. 4 shows a scanning electron micrograph image 405 of the silicon photonic device 100 corresponding to the design 305 shown in FIG. 3. Like the design 205 associated with the continuous evanescent perturbation gratings 110 shown in FIG. 1, the same continuous evanescent perturbation gratings 110 are formed on either side of the primary optical waveguide 120. According to one embodiment, the continuous evanescent perturbation gratings 110 are formed symmetrically such that the gap 320 between each of the continuous evanescent perturbation gratings 110 and the primary optical waveguide 120 is the same.

Figure 5:
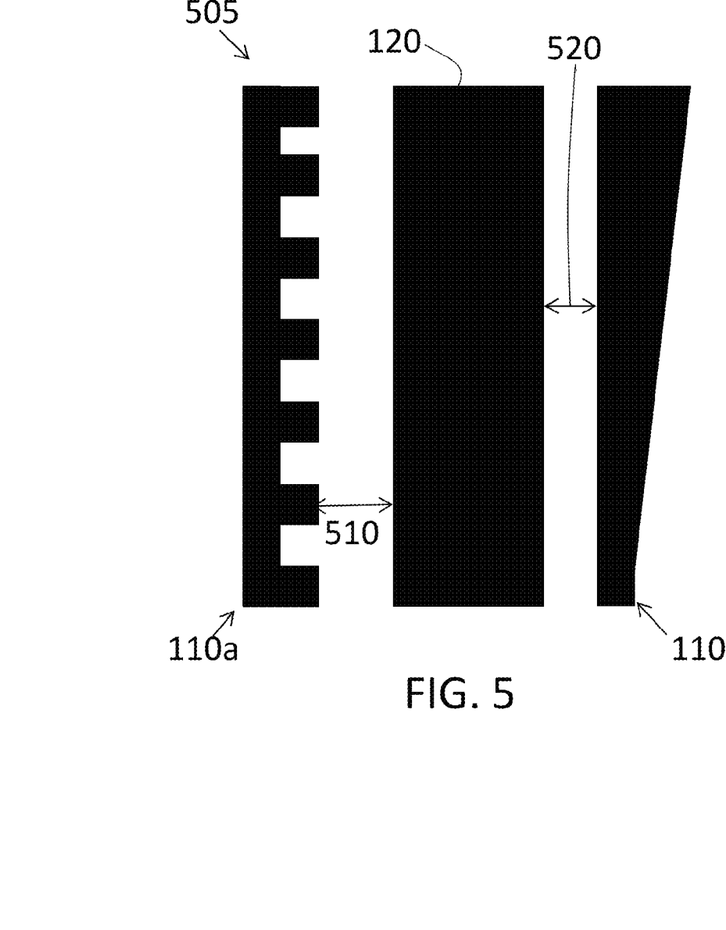
FIG. 5 illustrates a design of the silicon photonic device according to yet another embodiment.
Figure 6:
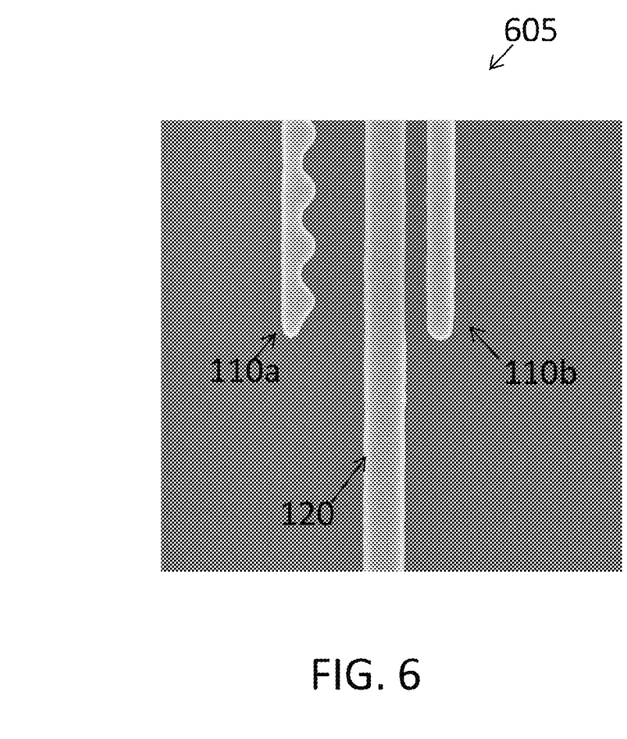
FIG. 6 shows a scanning electron micrograph image of the silicon photonic device corresponding to the design shown in FIG. 5.

FIG. 5 illustrates a design 505 of the silicon photonic device 100 according to yet another embodiment. The continuous evanescent perturbation gratings 110 according to the embodiment shown in FIG. 5 are not the same on either side of the primary optical waveguide 120. That is, the silicon photonic device 100 may be used for different purposes according to the two different continuous evanescent perturbation gratings 110. The continuous evanescent perturbation gratings 110a on one side include sawtooth or Manhattan gratings as in the embodiment associated with FIGS. 1 and 2. The sawtooth gratings control forward transmission or backward reflection of the incident optical signal. The continuous evanescent perturbation gratings 110b on the other side includes a taper that results in a chirp grating or a grating that has a different effect based on the incident optical frequency or wavelength. The taper controls propagation coefficient. In alternate embodiments to the one shown in FIG. 5, the continuous evanescent perturbation gratings 110a may be oriented as shown in FIG. 3, and the taper of the continuous evanescent perturbation gratings 110b may be on the side closest to the primary optical waveguide 120. The gaps 510, 520 between the primary optical waveguide 120 and each of the continuous evanescent perturbation gratings 110a, 110b may be but need not be the same. FIG. 6 shows a scanning electron micrograph image 605 of the silicon photonic device 100 corresponding to the design 505 shown in FIG. 5. The taper is not clearly visible on the scale of the scanning electron micrograph, because the taper slope is on the order of 1 nm per 1 µm in this example.

Figure 7:
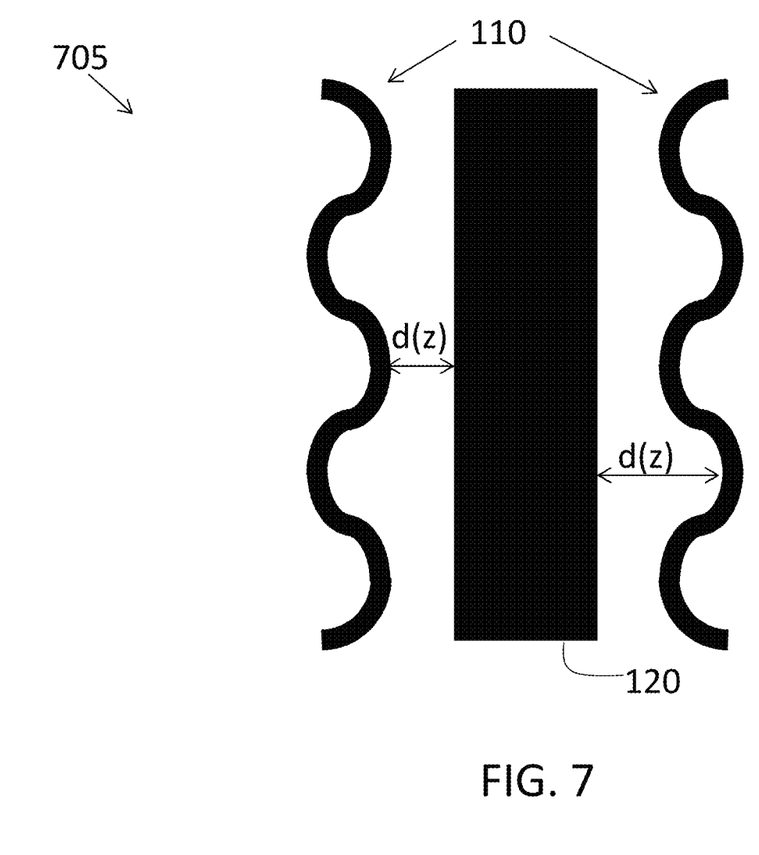
FIG. 7 illustrates a design of the silicon photonic device according to yet another embodiment.

FIG. 7 illustrates a design 705 of the silicon photonic device 100 according to yet another embodiment. The continuous evanescent perturbation gratings 110 are constant linewidth gratings as opposed to the sawtooth gratings shown in FIGS. 2 and 3, for example. An arbitrary function d(z) (where z represents the axis along the length of the continuous evanescent perturbation gratings 110) may be used to change a gap between the continuous evanescent perturbation gratings 110 and primary optical waveguide 120 along its length. As a result, the local field intensity (mode overlap) changes along the length of the continuous evanescent perturbation gratings 110. The reflection amplitude and phase is a function of the incident optical signal frequency.

Figure 8:
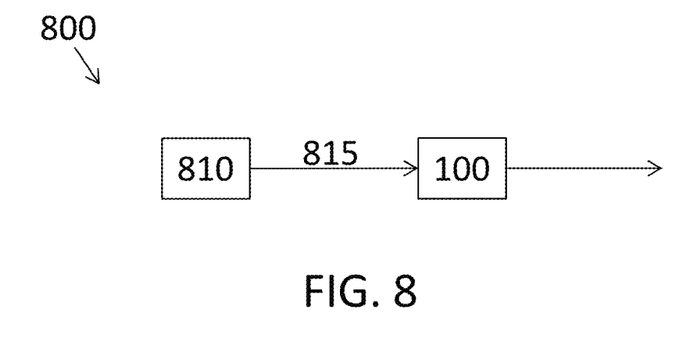
FIG. 8 is an exemplary system using a silicon photonic device according to embodiments.
Figure 9:
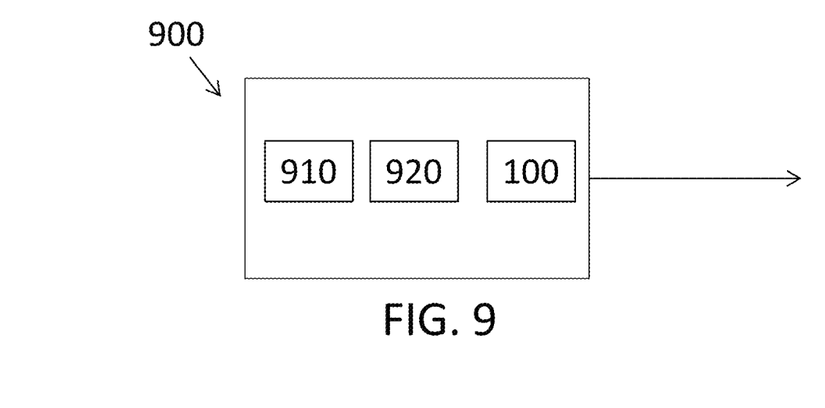
FIG. 9 is another exemplary system using a silicon photonic device according to embodiments.

FIG. 8 is an exemplary system 800 using a silicon photonic device 100 according to embodiments discussed herein. A light source 810 (e.g., laser) outputs incident light 815 for transmission by the silicon photonic device 100. The silicon photonic device 100 may modify the incident light 815 based on its frequency (e.g., per the chirp continuous evanescent perturbation gratings 110 shown in FIG. 5) or otherwise act on the incident light 815 to produce output light 820. FIG. 9 is another exemplary system 900 using a silicon photonic device 100 according to embodiments discussed herein. The system 900 is a laser that outputs power at a single controlled optical frequency. A light source 910 outputs light to an optical gain region 920 that is used in conjunction with embodiments of the silicon photonic device 100 that act as a reflection cavity.

Figure 10:
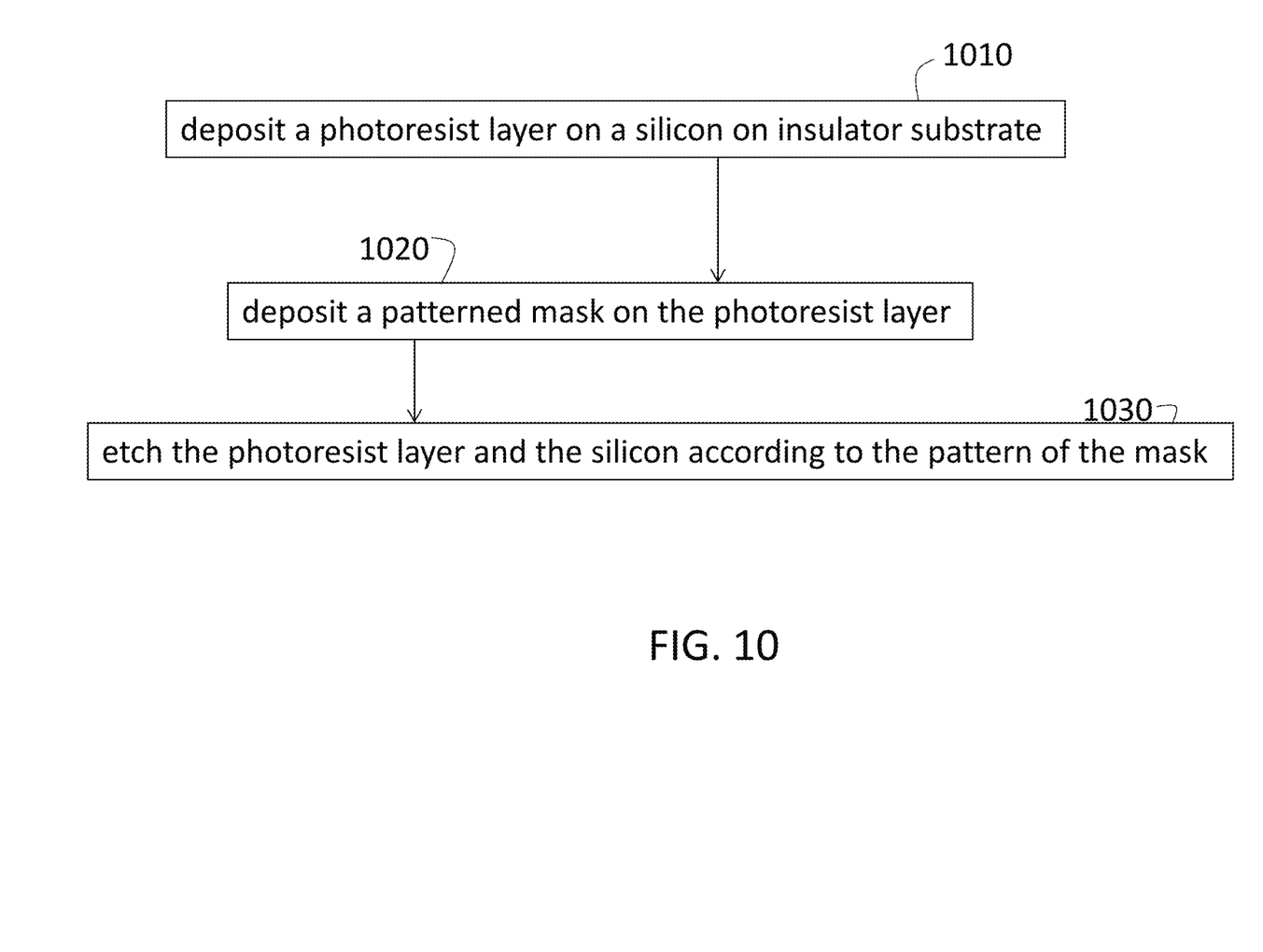
FIG. 10 is a process flow of a method of fabricating a silicon photonic device according to embodiments.

FIG. 10 is a process flow of a method of fabricating a silicon photonic device 100 according to embodiments discussed herein. At block 1010, the process flow includes depositing a photoresist layer on a silicon-on-insulator substrate. At block 1020, depositing a patterned mask on the photoresist layer includes patterning the mask according to the desired embodiment of the continuous evanescent perturbation gratings 110. Etching the photoresist layer and the silicon according to the pattern of the mask, at block 1030, includes the photoresist and silicon being etched to the pattern of the mask. This pattern includes the primary optical waveguide 120 and the continuous evanescent perturbation gratings 110. Known additional steps include removing the remaining photoresist layer over the patterned silicon to obtain the silicon photonic device 100.

Figure 11:
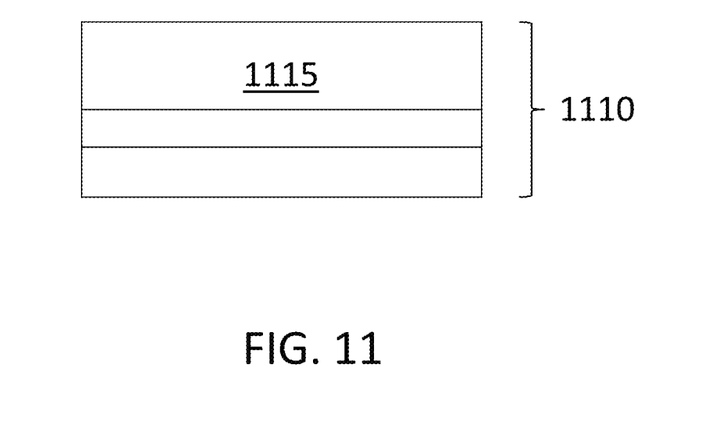
FIG. 11 shows a silicon-on-insulator (SOI) structure.
Figure 12:
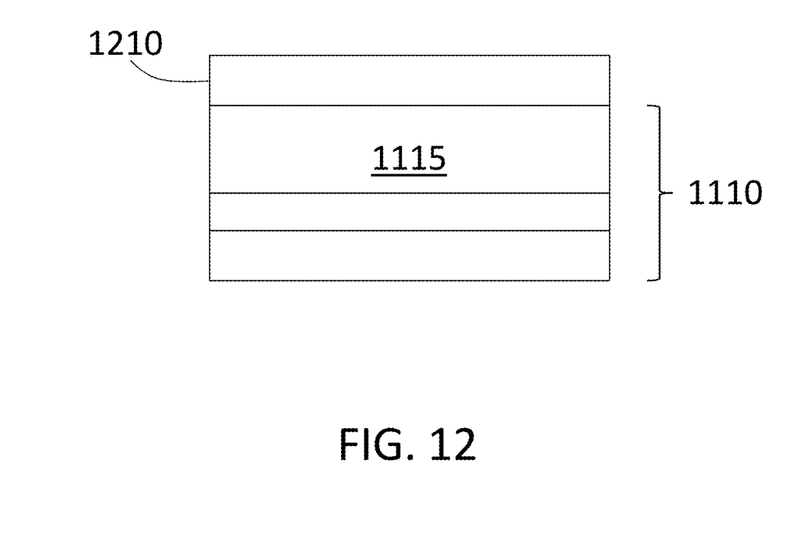
FIG. 12 shows the intermediate structure resulting from deposition of a photoresist layer on the SOI.
Figure 13:
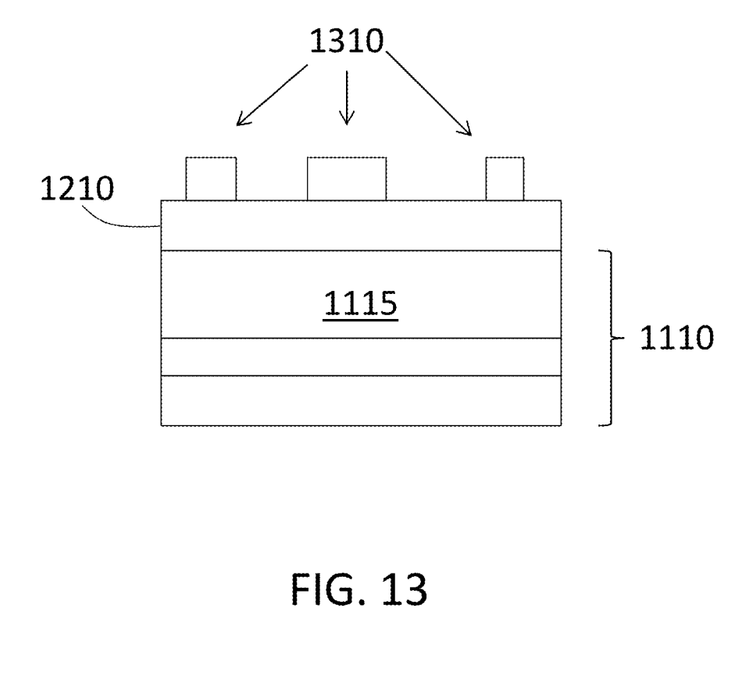
FIG. 13 shows a patterned mask on the photoresist layer of FIG. 12.

FIGS. 11-13 are cross-sectional views of intermediate structures involved in the fabrication of a silicon photonic device 100 according to embodiments detailed herein. FIG. 11 shows a silicon-on-insulator (SOI) structure 1110 with a silicon layer 1115 as the top layer. A photoresist layer 1210 is deposited on the SOI structure 1110 to form the intermediate structure shown in FIG. 12. As shown in FIG. 13, a patterned mask 1310 is deposited on the photoresist layer 1210. At this stage, known optical lithographic techniques are used to etch the photoresist layer 1210 and silicon layer 1115 into the pattern of the patterned mask 1310 and remove the photoresist layer 1210. As discussed above, the patterned mask 1310 may be patterned according to any number of alternate embodiments. The common feature is that the patterned mask 1310 corresponding to each of the primary optical waveguide 120 and each of the continuous evanescent perturbation gratings 110 is a continuous layer (into the drawing according to the perspective of FIG. 13).

The embodiments of the silicon photonic device 100 discussed above are illustrative but not exhaustive. Many variations are contemplated. For example, any of the shapes of the continuous evanescent perturbation gratings 110 may have a gap or distance to the primary optical waveguide 120 that is defined by a function. As noted among the embodiments discussed above, the continuous evanescent perturbation gratings 110 on each side of the primary optical waveguide 120 may be the same or different. That is, the silicon photonic device 100 may be symmetric or asymmetric. The common feature of all the continuous evanescent perturbation gratings 110 is that they are etched as a continuous feature in the same etch layer used to form the primary optical waveguide 120.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a silicon photonic device, the method comprising:
   forming a photoresist layer on a silicon layer;
   patterning a mask formed on the photoresist layer, the patterning the mask defining a primary optical waveguide region, a first evanescent perturbation grating region on a first side of the primary optical waveguide region and a second evanescent perturbation grating region on a second side, opposite the first side, of the primary optical waveguide, the first evanescent perturbation grating region and the second evanescent perturbation grating region being defined as continuous regions along a length of the silicon photonic device; and
   etching the photoresist layer and the silicon layer according to a pattern of the patterned mask.

2. The method according to claim 1, further comprising removing the photoresist layer following the etching.

3. The method according to claim 1, wherein patterning the mask includes defining the primary optical waveguide region as having a constant width over the length.

4. The method according to claim 1, wherein depositing patterning the mask includes defining the first evanescent perturbation grating region or the second evanescent perturbation grating region as a sawtooth pattern that includes a toothed side and a solid side.

5. The method according to claim 4, wherein patterning the mask includes defining the toothed side to be closest to the primary optical waveguide region.

6. The method according to claim 4, wherein patterning the mask includes defining the solid side to be closest to the primary optical waveguide region.

7. The method according to claim 1, wherein patterning the mask includes defining the first evanescent perturbation grating region or the second evanescent perturbation grating region to be tapered.

8. The method according to claim 1, wherein patterning the mask includes defining the first evanescent perturbation grating region or the second evanescent perturbation grating region as a constant linewidth shape with a distance from the primary optical waveguide region defined as a function of position along the length.

9. The method according to claim 1, wherein patterning the mask includes defining the primary optical waveguide region and the first evanescent perturbation grating region and the second evanescent perturbation grating region to be symmetrical such that the first evanescent perturbation grating region and the second evanescent perturbation grating region are mirror images of each other.

* * * * *